US011968871B2

(12) United States Patent
Yu et al.

(10) Patent No.: US 11,968,871 B2
(45) Date of Patent: Apr. 23, 2024

(54) DISPLAY SUBSTRATE FACILITATING INK INJECTION, METHOD FOR MANUFACTURING THE DISPLAY SUBSTRATE AND DISPLAY DEVICE

(71) Applicant: BOE TECHNOLOGY GROUP CO., LTD., Beijing (CN)

(72) Inventors: Yong Yu, Beijing (CN); Yang Yue, Beijing (CN); Haitao Huang, Beijing (CN); Xiang Li, Beijing (CN); Shi Shu, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 591 days.

(21) Appl. No.: 17/265,241

(22) PCT Filed: Jun. 16, 2020

(86) PCT No.: PCT/CN2020/096314
§ 371 (c)(1),
(2) Date: Feb. 2, 2021

(87) PCT Pub. No.: WO2020/259351
PCT Pub. Date: Dec. 30, 2020

(65) Prior Publication Data
US 2021/0305331 A1    Sep. 30, 2021

(30) Foreign Application Priority Data
Jun. 25, 2019 (CN) .......................... 201910554837.3

(51) Int. Cl.
*H10K 59/35* (2023.01)
*H10K 50/80* (2023.01)
(Continued)

(52) U.S. Cl.
CPC ......... *H10K 59/353* (2023.02); *H10K 50/868* (2023.02); *H10K 59/122* (2023.02);
(Continued)

(58) Field of Classification Search
CPC .. H10K 59/353; H10K 50/868; H10K 59/122; H10K 59/38; H10K 59/1201; H10K 71/00
(Continued)

(56) References Cited

U.S. PATENT DOCUMENTS

2011/0156079 A1* 6/2011 Nakatani ................ H10K 50/17
257/98
2020/0343315 A1* 10/2020 Lin ....................... H10K 59/126

FOREIGN PATENT DOCUMENTS

CN    1654519 A    8/2005
CN    102110788 A    6/2011
(Continued)

OTHER PUBLICATIONS

China Patent Office, First Office Action dated Jan. 6, 2021 for application No. CN201910554837.3.
(Continued)

*Primary Examiner* — Quoc D Hoang
(74) *Attorney, Agent, or Firm* — HOUTTEMAN LAW LLC (57) ABSTRACT

The disclosure provides a display substrate, a manufacturing method thereof and a display device. The display substrate has a plurality of subpixel regions. The display substrate includes a base substrate and a pixel definition layer on the base substrate. The pixel definition layer defines a plurality of subpixel openings and each of the subpixel openings occupies one subpixel region. The display substrate further includes a functional medium layer on a side of the pixel definition layer away from the base substrate. The functional medium layer includes a first portion covering side surfaces of the subpixel opening and a second portion covering a top surface of the pixel definition layer. In the same subpixel region, surface energy of the first portion is greater than surface energy of the second portion.

15 Claims, 3 Drawing Sheets

(51) Int. Cl.
*H10K 59/122* (2023.01)
*H10K 59/38* (2023.01)
*H10K 71/00* (2023.01)
*H10K 59/12* (2023.01)

(52) U.S. Cl.
CPC ............ *H10K 59/38* (2023.02); *H10K 71/00* (2023.02); *H10K 59/1201* (2023.02)

(58) Field of Classification Search
USPC .......................................................... 257/40
See application file for complete search history.

(56) References Cited

FOREIGN PATENT DOCUMENTS

| | | |
|---|---|---|
| CN | 103681743 A | 3/2014 |
| CN | 104253244 A | 12/2014 |
| CN | 104637982 A | 5/2015 |
| CN | 104733505 A | 6/2015 |
| CN | 107248523 A | 10/2017 |
| CN | 108695437 A | 10/2018 |
| CN | 109037490 A | 12/2018 |
| CN | 109307950 A | 2/2019 |
| CN | 110265451 A | 9/2019 |

OTHER PUBLICATIONS

Changcheng He et al., "Overview of PET Grafting"; published Sep. 30, 2013, Tianjin University of Technology and Science.

* cited by examiner

DISPLAY SUBSTRATE FACILITATING INK INJECTION, METHOD FOR MANUFACTURING THE DISPLAY SUBSTRATE AND DISPLAY DEVICE

CROSS-REFERENCE TO RELATED APPLICATIONS

This application is a National Phase Application filed under 35 U.S.C. 371 as a national stage of PCT/CN2020/096314, filed on Jun. 16, 2020, an application claiming the priority of the Chinese patent application No. 201910554837.3, filed Jun. 25, 2019, the contents of which are incorporated herein by reference in their entirety.

TECHNICAL FIELD

The present disclosure relates to the field of display technologies, and in particular, to a display substrate, a display device and a method for manufacturing a display substrate.

BACKGROUND

The printing process has been widely used in the manufacturing process of the display substrate. For example, during a process for manufacturing OLED display substrates, an organic functional layer is printed in subpixel openings defined by the pixel definition layer through a printing process. For another example, during a process for manufacturing a color filter substrate of a liquid crystal display device, a pixel definition layer is formed on the formed color filter substrate, and then a quantum dot material is printed in the subpixel openings defined by the pixel definition layer, thereby improving the color gamut.

SUMMARY

As an aspect, a display substrate is provided. The display substrate has a plurality of subpixel regions. The display substrate includes a base substrate and a pixel definition layer for defining a plurality of subpixel openings on the base substrate. Each of the subpixel openings occupies one of the subpixel regions. The display substrate further includes a functional medium layer on a side of the pixel definition layer away from the base substrate. The functional medium layer includes a first portion covering side surfaces of each of the subpixel openings and a second portion covering a top surface of the pixel definition layer. In the same subpixel region, surface energy of the first portion is greater than surface energy of the second portion.

In an embodiment, each of the first and second portions includes a lyophobic polymer photo-grafted with a lyophilic monomer material, and a grafting ratio of the first portion is greater than a grafting ratio of the second portion.

In an embodiment, the display substrate further includes a body material layer between the pixel definition layer and the functional medium layer and covering a bottom of each of the subpixel openings and the top surface and side surfaces of the pixel definition layer. A portion of the body material layer covering the bottom of the subpixel opening serves as a third portion, and a surface of the third portion away from the base substrate is a rough surface.

In an embodiment, the rough surface has a roughness in a range from 2 μm to 10 μm.

In an embodiment, the body material layer includes a lyophobic polymer. Both of the lyophobic polymer in the body material layer and the lyophobic polymer photografted with the lyophilic monomer material are polyethylene terephthalate, and the lyophilic monomer material is acrylic acid or acrylamide.

In an embodiment, the display substrate further includes a red display pattern, a green display pattern and a blue display pattern respectively in the plurality of subpixel openings, all of the display patterns including an ink-type material. The red display pattern includes a red quantum dot photoluminescent material, the green display pattern includes a green quantum dot photoluminescent material, and the blue display pattern includes a blue color filter material.

In an embodiment, the display substrate further includes a plurality of color filter films between the base substrate and the pixel definition layer. The plurality of color filter films are in one-to-one correspondence with the plurality of subpixel regions respectively. The plurality of color filter films include a red color filter film, a green color filter film and a blue color filter film. An orthographic projection of the red color filter film on the base substrate overlaps an orthographic projection of the red display pattern on the base substrate, an orthographic projection of the green color filter film on the base substrate overlaps an orthographic projection of the green display pattern on the base substrate, and an orthographic projection of the blue color filter film on the base substrate overlaps an orthographic projection of the blue display pattern on the base substrate.

In an embodiment, the display substrate further includes a planarization layer and a wire-grid polarizing plate. The planarization layer is on a side of the subpixel openings away from the base substrate and covers the plurality of subpixel openings. The wire-grid polarizing plate is on a side of the planarization layer away from the base substrate.

As another aspect, a display device including the display substrate described above is provided.

As yet another aspect, a method for manufacturing a display substrate is provided. The method includes: forming a pixel definition layer on a base substrate, the pixel definition layer defining a plurality of subpixel openings, and each of the subpixel openings occupying one subpixel region; forming a functional medium layer in each subpixel region and on a side of the pixel definition layer away from the base substrate. The functional medium layer includes a first portion covering side surfaces of each of the subpixel openings and a second portion covering a top surface of the pixel definition layer. In the same subpixel region, surface energy of the first portion is larger than surface energy of the second portion.

In an embodiment, forming the functional medium layer in each subpixel region and on a side of the pixel definition layer away from the base substrate includes: forming a lyophobic polymer layer covering a bottom of each of the subpixel openings, the side surfaces of each of the subpixel openings, and the top surface of the pixel definition layer to obtain a body material layer; forming a lyophilic monomer material layer on a side of the body material layer away from the base substrate; exposing the body material layer and the lyophilic monomer material layer such that: in any one subpixel region, portions of the body material layer and the lyophilic monomer material layer at the bottom of each of the subpixel openings are not exposed, and an exposure amount of portions of the body material layer and the lyophilic monomer material layer at the side surfaces of each of the subpixel openings is greater than an exposure amount of portions of the body material layer and the lyophilic monomer material layer at the top surface of the pixel definition layer, and a lyophilic monomer material in the lyophilic monomer material layer is photo-grafted with lyophobic polymer in an upper portion of the body material layer to form the first portion and the second portion of the functional medium layer, and a grafting ratio of the first portion is greater than a grafting ratio of the second portion; and removing the lyophilic monomer material layer at the bottom of each of the subpixel openings.

In an embodiment, the method further includes after the lyophilic monomer material layer at the bottom of each of the subpixel openings is removed, dry-etching a third portion of the body material layer at the bottom of each of the subpixel openings to form a rough surface.

In an embodiment, the rough surface has a roughness in a range from 2 μm to 10 μm.

In an embodiment, the lyophobic polymer is polyethylene terephthalate, and the lyophilic monomer material is acrylic acid or acrylamide.

In an embodiment, after dry-etching the third portion of the body material layer at the bottom of each of the subpixel openings to form the rough surface, the method further includes respectively forming a red display pattern, a green display pattern and a blue display pattern in the plurality of subpixel openings, wherein all of the display patterns are made of an ink-type material; curing the red display pattern, the green display pattern, and the blue display pattern. The red display pattern is made of a red quantum dot photoluminescent material, the green display pattern is made of a green quantum dot photoluminescent material, and the blue display pattern is made of a blue color filter material.

In an embodiment, the method further includes forming a red color filter film, a green color filter film and a blue color filter film in sequence between the base substrate and the pixel definition layer. The red color filter film, the green color filter film and the blue color filter film are in one-to-on correspondence to the plurality of subpixel regions respectively. An orthographic projection of the red color filter film on the base substrate overlaps an orthographic projection of the red display pattern on the base substrate, an orthographic projection of the green color filter film on the base substrate overlaps an orthographic projection of the green display pattern on the base substrate, and an orthographic projection of the blue color filter film on the base substrate overlaps an orthographic projection of the blue display pattern on the base substrate.

In an embodiment, the method further includes forming a planarization layer on a side of the plurality of subpixel openings away from the base substrate to cover each of the subpixel openings; and forming a wire-grid polarizing plate on a side of the planarization layer away from the base substrate.

DETAILED DESCRIPTION

In order to make those skilled in the art better understand the technical solutions of the present disclosure, the present disclosure is further described in detail below with reference to the accompanying drawings and specific embodiments.

In the present disclosure, the "patterning process" refers to a process for forming a structure having a specific pattern, such as a photolithography process including one or more steps of forming a material layer, coating a photoresist, exposing, developing, etching, and removing the photoresist, and the like; of course, the "patterning process" may also refer to an imprinting process, an inkjet printing process, or other processes.

In the related art, in order to keep the ink material flat after the ink material is dried, surface energy of a top surface of the pixel definition layer needs to be small, and surface energy of a side surface of the pixel definition layer needs to be large. However, the material of the pixel definition layer has a uniform property, therefore the pixel definition layer does not satisfy the above requirements. In order to form the ink material that is flat after the ink material is dried without overflowing the top of the pixel definition layer, only the appropriately decreased amount of the ink material may be dropped into the subpixel opening, which in turn results in a thin thickness of the dried ink material, and relatively large step difference after the ink material is cured. In subsequent processes, when other layers, such as a planarization layer and a wire-grid polarizing layer, are formed on the ink material and the pixel definition layer, the difficulty of planarization process for those layers is also increased.

As used herein, the term "display region" refers to a region of a display substrate where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

A corresponding one of the plurality of subpixels includes a subpixel region and a portion of an inter-subpixel region surrounding the subpixel region.

Figure 1A:
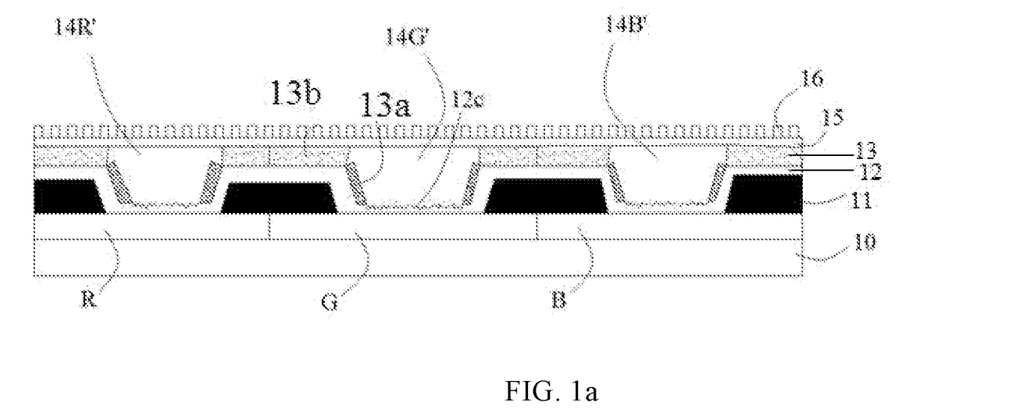
FIG. 1a is a schematic diagram showing a structure of a display substrate according to an embodiment of the disclosure.
Figure 1B:
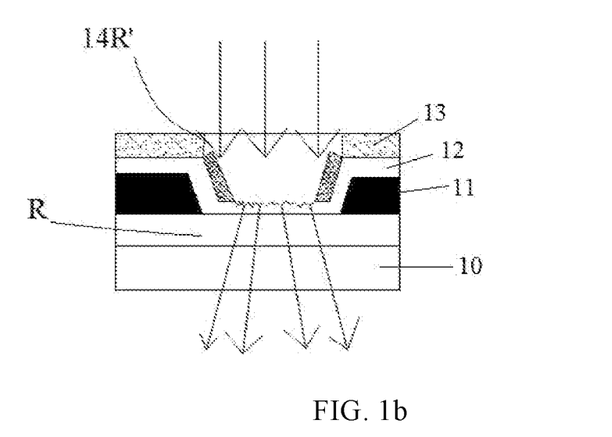
FIG. 1b is an optical path diagram of a display substrate according to an embodiment of the present disclosure.

With reference to FIGS. 1a and 1b, an embodiment of the present disclosure provides a display substrate including a plurality of subpixel regions, such as a red subpixel region, a green subpixel region, and a blue subpixel region. The display substrate includes a base substrate 10 and a pixel definition layer 11 arranged on the base substrate 10. The pixel definition layer 11 defines a plurality of subpixel openings, a region in which each of the subpixel openings is located is one subpixel region, and one subpixel opening is located in a corresponding subpixel region. One subpixel opening occupies one subpixel region. An orthographic projection of the subpixel opening on the base substrate 10 completely overlaps an orthographic projection of the subpixel region on the base substrate 10.

In an embodiment, the display substrate further includes display patterns, such as a red display pattern 14R', a green display pattern 14G', and a blue display pattern 14B', which are located in the subpixel openings and made of an ink-type material. Each of the display patterns made of the ink-type material is thicker than that in the related art, thereby reducing the difficulty of the subsequent planarization process.

In an embodiment, the display substrate further includes color filter films, such as a red color filter film R, a green color filter film G, and a blue color filter film B that are disposed on the base substrate 10. The color filter films are in one-to-one correspondence with the plurality of subpixel regions. The pixel definition layer 11 is located on a side of the color filter films away from the base substrate 10, and a bottom of each of the subpixel openings faces one of the color filter films. Orthographic projections of the color filter films on the base substrate 10 respectively overlap orthographic projections of the plurality of subpixel regions on the base substrate 10 in a one-to-one correspondence manner. The plurality of color filter films include color filter films in a first color and color filter films in a second color.

The first color is red or green. An orthographic projection of the red color filter film R on the base substrate 10 overlaps an orthographic projection of the red display pattern 14R' on the base substrate 10, and the red display pattern 14R' includes a red quantum dot photoluminescent material. An orthographic projection of the green color filter film G on the base substrate 10 overlaps an orthographic projection of the green display pattern 14G' on the base substrate 10, and the green display pattern 14G' includes a green quantum dot photoluminescent material.

The second color is blue. An orthogonal projection of the blue display pattern 14B' on the base substrate 10 overlaps an orthogonal projection of the blue color filter film B on the base substrate 10, and the blue display pattern 14B' includes a blue color filter material.

That is, the light for displaying sequentially passes through the display pattern and the corresponding color filter film. The quantum dot photoluminescent material enhances the brightness and the purity of the color light transmitted through the corresponding subpixel, thereby improving the color gamut.

In an embodiment, for example, referring to FIG. 1a, the red display pattern includes a red quantum dot photoluminescent material for enhancing the red light; the green display pattern includes a green quantum dot photoluminescent material for enhancing the green light. Among the three primary colors, the blue light has the shortest wavelength and the highest energy, and is not easy to be enhanced compared with the red or green light, therefore the blue display pattern includes a blue color filter material that is capable of being formulated as an ink-type material.

Taking FIG. 1a as an example, the red display pattern 14R' and the green display pattern 14G' respectively include a red quantum dot photoluminescent material capable of being excited to emit the red light and a green quantum dot photoluminescent material capable of being excited to emit the green light. Referring to FIG. 1b, taking an embodiment in which the light passes through the red subpixel region as an example, in practical applications, after the light is transmitted to the red display pattern 14R', the red component of the light is enhanced, and then the enhanced light is transmitted through the red color filter film R for display. In an embodiment, the light is diffusely reflected on a rough surface of the third portion 12c having a roughness in a range of 2 μm to 10 μm, thereby improving the diffuse reflection of the light, improving the light conversion efficiency of the quantum dot photoluminescent material, and improving the white balance of the display device.

It should be noted that the color filter films R, G, B are used for improving the color gamut of the emergent light in the present disclosure, however, in an embodiment, the display substrate may not include the color filter films R, G, B.

In an embodiment, the display substrate includes a body material layer 12 on a side of the pixel definition layer 11 and the plurality of color filter films R, G, B away from the base substrate 10. The body material layer 12 extends on a top surface and side surfaces of the pixel definition layer 11 and extends at the bottom of the subpixel opening. The body material layer 12 extends on portions of the plurality of color filter films R, G, B not covered by the pixel definition layer 11. The body material layer 12 contains a lyophobic polymer, such as polyethylene terephthalate (PET), and alternatively, the body material layer 12 may be other transparent polymer material film.

The pixel definition layer 11 defines a light emitting area of each of the subpixel regions. The material of the pixel definition layer 11 may be a transparent material or an opaque material; and in an embodiment, the pixel definition layer 11 is made of an opaque material.

The display substrate further includes a functional medium layer 13 on a side of the body material layer 12 away from the base substrate 10 and covering (e.g., covering only) a top surface of the pixel definition layer 11 and the side surfaces of the subpixel opening.

The functional medium layer 13 includes: a first portion 13a covering the side surfaces of the subpixel opening and a second portion 13b covering the top surface of the pixel definition layer 11. Surface energy of the first portion 13a is greater than surface energy of the second portion 13b in the same subpixel region.

In the present disclosure, the first portion 13a has a relatively large surface energy and a better lyophilic property for most materials, which is beneficial for the ink-type material to be better wetted in the bottom region of the subpixel opening during the subsequent process. The second portion 13b has a relatively small surface energy and a relatively poor lyophilic property, therefore even if the top of the ink-type material is higher than the top of the subpixel opening after the ink-type material is injected into the subpixel opening during the subsequent process, the ink-type material cannot overflow, that is, a relatively large contact angle is between the ink-type material and the second portion 13b of the functional medium layer. Thus, more ink-type material can be injected into the subpixel opening, and the thickness of the dried ink-type material during subsequent process can be increased accordingly, which is beneficial to the subsequent planarization process.

In an embodiment, the portion of the body material layer 12 located at the bottom of the subpixel opening and not covered by the functional medium layer 13 serves as the third portion 12c, and a surface of the third portion 12c away from the base substrate 10 is a rough surface having a roughness in a range from 2 μm to 10 μm.

In an embodiment, the body material layer 12 contains a lyophobic polymer, such as polyethylene terephthalate (PET), i.e., the third portion 12c includes polyethylene terephthalate.

In order to realize above concept of the present disclosure, it is only required to control the surface energies of the first and second portions 13a and 13b. An example structure for realizing the control of the surface energy is as follows.

In an embodiment, the first portion 13a is formed by photo-grafting a lyophilic monomer on the surface of a lyophobic polymer at an upper portion of the body material layer 12. The second portion 13b is formed by photo-grafting the lyophilic monomer on the surface of the lyophobic polymer at an upper portion of the body material layer 12. A grafting ratio of the first portion 13a is greater than a grafting ratio of the second portion 13b.

Different regions of the same lyophobic polymer may be photo-grafted to different degrees using the lyophilic monomer to obtain the first portion 13a and the second portion 13b having different surface energies.

However, the method for changing the surface energy of the material is not limited thereto.

It should be noted that, since the surface energies of the first portion 13a and the second portion 13b can be designed by a certain method, different surface energies of the ink-type materials with different properties and different colors can also be designed, thereby realizing the consistency of the thicknesses or other parameters of the display patterns in different colors when the display patterns are formed in the subpixel openings.

The display substrate further includes a planarization layer 15 covering each of the subpixel openings and located on a side of the subpixel openings away from the base substrate 10.

The display substrate further includes a wire-grid polarizing plate 16 located on a side of the planarization layer 15 away from the base substrate 10.

The display substrate shown in FIG. 1a may be applied to a liquid crystal display panel or a WOLED type based OLED display panel. The display substrate in this embodiment may also be an OLED display substrate, that is, an ink-type material may be used to form an organic functional layer (e.g., an electron transport layer, a composite light emitting layer, a hole transport layer, and the like) in the subpixel openings.

An embodiment of the present disclosure provides a display device, which includes the display substrate described above.

The display device can be any product or component with a display function, such as a liquid crystal display panel, an Organic Light Emitting Diode (OLED) display panel, a mobile phone, a tablet computer, a television, a display, a notebook computer, a digital photo frame, a navigator, or the like.

The planarization difficulty of the film layers on the pixel definition layer 11 of the display device is reduced and the optical performance of the display device is improved.

Figure 2:
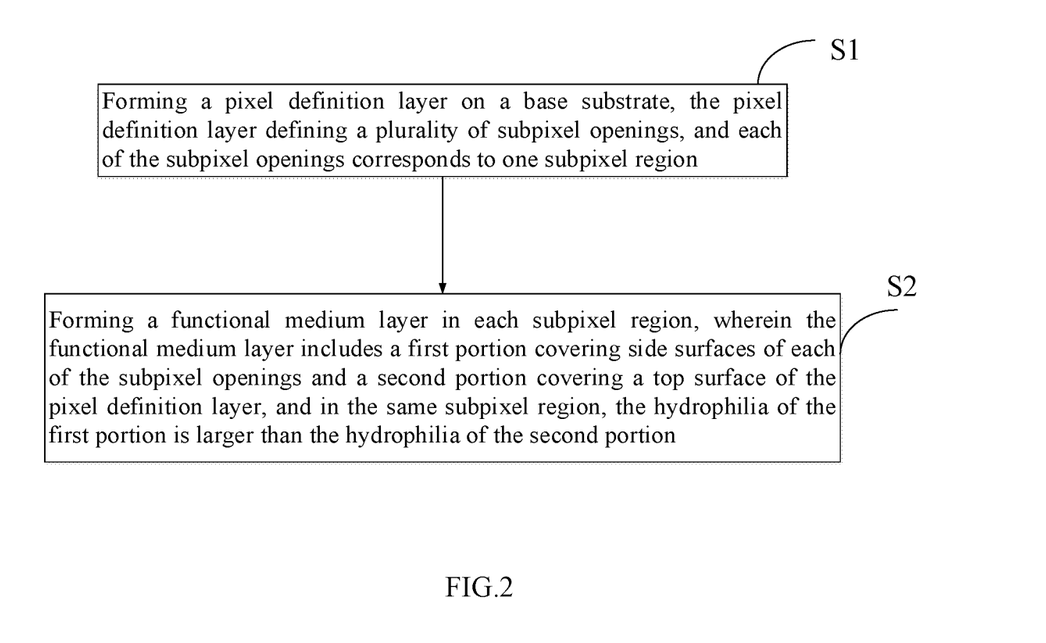
FIG. 2 is a flowchart showing a method for manufacturing a display substrate according to an embodiment of the present disclosure.

Referring to FIG. 2 in combination with FIGS. 3a to 3f and FIG. 1a, an embodiment of the present disclosure provides a method for manufacturing a display substrate. The manufacturing method includes step S1 and step S2.

At step S1, a pixel definition layer 11 is formed on a base substrate 10. The pixel definition layer 11 defines a plurality of subpixel openings, a region where each of the subpixel openings is located is one subpixel region. Each of the subpixel openings occupies one subpixel region.

At step S2, a functional medium layer is formed in each subpixel region and on a side of the pixel definition layer away from the base substrate. The functional medium layer includes: a first portion 13a covering the side surfaces of the subpixel opening and a second portion 13b covering a top surface of the pixel definition layer 11. Surface energy of the first portion 13a is greater than surface energy of the second portion 13b in the same subpixel region.

In an embodiment, forming the functional medium layer in each subpixel region includes steps S21 to S24.

At step S21, a lyophobic polymer material layer covering the bottom of the subpixel opening, the side surfaces of the subpixel opening, and the top surface of the pixel definition layer 11 is formed to obtain a body material layer 12.

At step S22, a lyophilic monomer material layer 13 covering the body material layer 12 is formed.

At step S23, the regional exposure is performed on both of the body material layer 12 and the lyophilic monomer material layer 13 by a digital exposure machine. In any one of the subpixel regions, portions of the body material layer 12 and the lyophilic monomer material layer 13 located at the bottom of the subpixel opening are not exposed, and the exposure amount of portions of the body material layer 12 and the lyophilic monomer material layer 13 located at the side surfaces of the subpixel opening is greater than the exposure amount of portions of the body material layer 12 and the lyophilic monomer material layer 13 located at the top surface of the pixel definition layer 11.

Not only the lyophilic monomer material layer 13 but also the top surface of the body material layer 12 is irradiated with light, i.e., exposed. Under the effect of exposure, the acrylic acid in the lyophilic monomer material layer 13 is photo-grafted with the polyethylene terephthalate material in an upper portion of the body material layer 12. However, the polyethylene terephthalate material in the middle and lower portions of the body material layer 12 are not affected by the exposure.

The greater the exposure amount, the more the lyophilic monomer in the lyophilic monomer material layer 13 is bonded to the lyophobic polymer in the body material layer 12, and the greater the surface energy of the resultant material has. In order to realize different exposure amounts in different regions, a plurality of mask plates may be used for exposing the different regions with different exposure amounts. The exposure times of the different regions may be accurately controlled by using a digital exposure machine, thereby realizing the exposure of different regions by using different exposure amounts during one exposure process.

At step S24, the remaining lyophilic monomer material layer 13 at the bottom of the subpixel opening is removed. A portion formed by the lyophobic polymer photo-grafted with the lyophilic monomer material and located on the side surfaces of the subpixel opening serves as a first portion 13a, and a portion formed by the lyophobic polymer photo-grafted with the lyophilic monomer material and located on the top surface of the pixel definition layer serves as a second portion 13b. Therefore, the different surface energies in the different regions of the same material layer can be realized.

In an embodiment, after the remaining lyophilic monomer material layer 13 at the bottom of the subpixel opening is removed, the method further includes: dry-etching a portion of the body material layer 12 located at the bottom of the subpixel opening to form a rough surface with a roughness in a range from 2 μm to 10 μm. The portion of the body material layer 12 located at the bottom of the subpixel opening serves as a third portion 12c. The third portion 12c has a rough surface after the third portion 12c is dry-etched, which facilitates the diffuse reflection of the light. In another embodiment, the third portion 12c may also be completely etched away.

In an embodiment, after the portion of the body material layer 12 located at the bottom of the subpixel opening is dry-etched to form the rough surface, the method further includes forming a display pattern in the subpixel opening by using an ink-type material.

Therefore, the height or thickness of the resultant display pattern after being dried is increased, and the uniformity of the height or thickness is more easily controlled.

FIGS. 3a to 3f are schematic diagrams showing steps for manufacturing a display substrate according to an embodiment of the present disclosure.

Figure 3A:
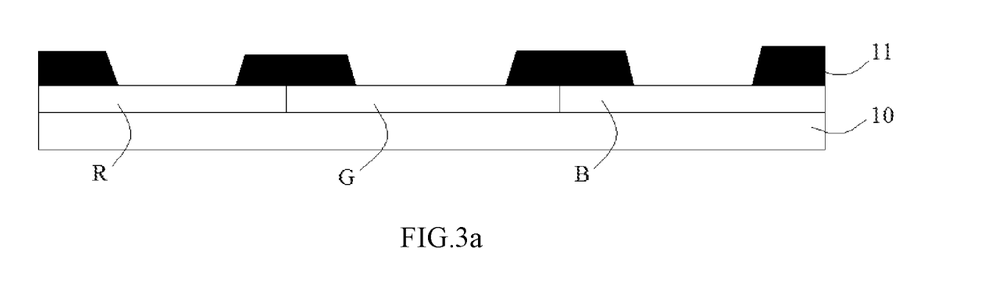
FIGS. 3a to 3f are schematic diagrams showing steps for manufacturing a display substrate according to an embodiment of the disclosure.

Referring to FIG. 3a, a red color filter film R, a green color filter film G, and a blue color filter film B are respectively formed on a base substrate 10 through a patterning process.

Next, a pixel definition layer 11 is formed at boundaries of the color filter films through a patterning process to cover adjacent color filter films.

Figure 3B:
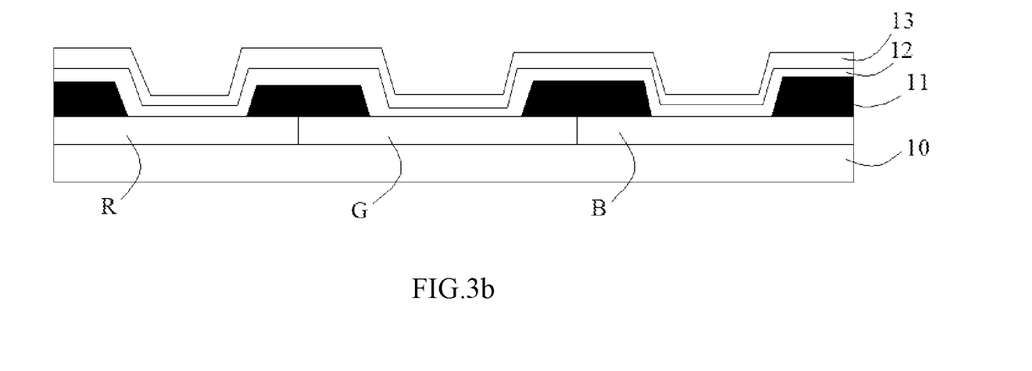

Referring to FIG. 3b, a body material layer 12 is formed to cover the pixel definition layer 11 and the exposed color filter films. The body material layer 12 contains a lyophobic polymer, for example, polyethylene terephthalate (PET).

Referring to FIG. 3b, next, a lyophilic monomer material layer 13 is formed to cover the body material layer 12. The lyophilic monomer material layer 13 includes, for example, an acrylic acid film or an acrylamide film, or includes, for example, an unsaturated monomer sensitive to light.

Figure 3C:
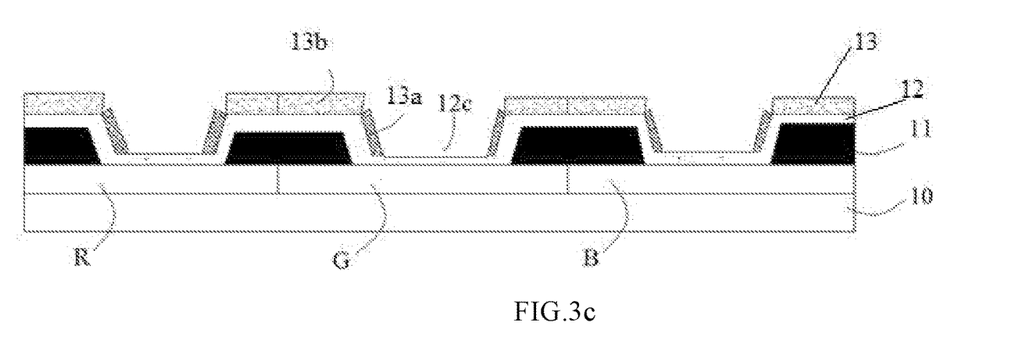

Referring to FIG. 3c, the body material layer 12 and the lyophilic monomer material layer 13 in different regions are exposed for different time periods by using a digital exposure machine, so that the polymers in the different regions have different grafting ratios. The grafting ratio refers to a proportion of lyophilic group in the polymer. The higher the grafting ratio, the higher the proportion of the lyophilic group in the resultant polymer is. For example, in FIG. 3c, the first portion 13a covering side surfaces of the subpixel opening has the highest grafting ratio after being exposed, the second portion 13b covering the top surface of the pixel definition layer has a relatively small grafting ratio after being exposed, and the third portion 12c in the pixel opening region is not exposed. As a result, a functional medium layer 13 including the first portion 13a and the second portion 13b is formed on a side of the body material layer 12 away from the base substrate 10.

When the digital exposure machine is used for exposure, no mask plate is needed, only programming is needed for control Since the third portion 12c of the body material layer 12 located in the pixel opening region is not exposed, only the body material layer 12c (i.e., the PET film layer) in the pixel opening region is retained, after the development process by which the portion of the lyophilic monomer material layer 13 (i.e., the acrylic acid film) located in the pixel opening region is removed, as shown in FIG. 3c.

Table 1 shows examples of an exposure time for exposing the top surface of the pixel definition layer 11 and an exposure time for exposing the side surfaces of the pixel definition layer 11 in the subpixel regions in different colors. The polyethylene terephthalate film in the upper portion of the body material layer 12 is photo-grafted with the acrylic acid in the lyophilic monomer material layer 13. The illuminance of the digital exposure machine is 50 mw/cm$^2$.

Figure 3D:
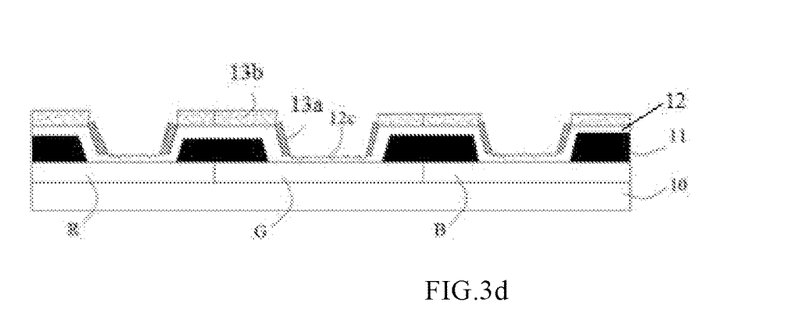

Referring to FIG. 3d, the polyethylene terephthalate film at the bottom of the subpixel opening is dry-etched to roughen the surface of the body material layer 12. The rough surface may have a roughness in a range from 2 μm to 10 μm, thereby improving the diffuse reflection of the light, improving the quantum efficiency of the quantum dots, and improving the white balance of the display device.

Figure 3E:
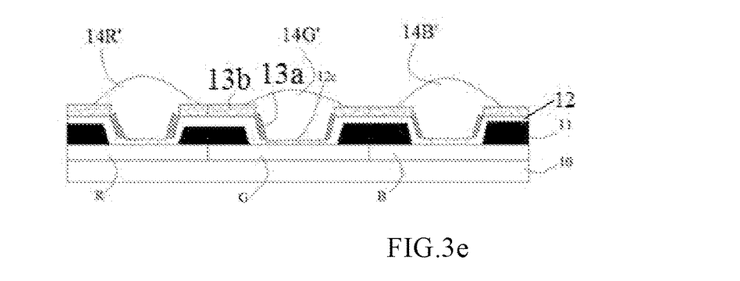

Referring to FIG. 3e, a red display pattern 14R' including a red quantum dot photoluminescent material, a green display pattern 14G' including a green quantum dot photoluminescent material, and a blue display pattern 14B' including a blue color filter material are formed in the plurality of subpixel openings through an inkjet printing process. Since the surface energies of the first and second portions 13a and 13b can be precisely controlled, the amount of ink-type material in each of the subpixel openings can be precisely controlled too, that is, the ink-type material in each of the subpixel openings can be slightly higher than the top of the subpixel opening without overflowing.

Figure 3F:
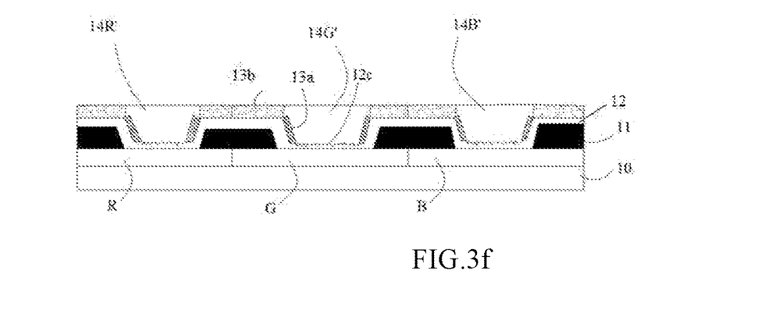

Referring to FIG. 3f, the above-described ink-type material is cured by photo-curing, thermal curing, or a combination of photo-curing and thermal curing. If thermal curing is selected, the curing temperature should be lower than 150° C. due to the poor thermal stability of the quantum dot photoluminescent material. The state of the cured product is shown in FIG. 3f. According to the manufacturing method of the present embodiment, the cured red display pattern 14R', the cured green display pattern 14G', and the cured blue display pattern 14B' may have the same height which is higher than a height in the related art.

Finally, a planarization layer 15 and a wire-grid polarizing plate 16 are formed. In an example, firstly the planarization layer 15 is formed, and then a metal layer, an inorganic protective layer, and an imprint resist are sequentially formed. The imprint resist is imprinted such that a portion of the imprint resist corresponding to the metal layer to be removed is extruded out. After the imprint resist is imprinted and cured, the exposed inorganic protective layer and the metal layer below the exposed inorganic protective layer are removed through a dry-etching process. In the region where the imprint resist is remained, the inorganic protective layer and the metal layer below the imprint resist are remained, and finally the remaining imprint resist is removed, so that the wire-grid polarizing plate 16 is formed. In an embodiment, a distance between two adjacent metal lines of the wire-grid polarizing plate 16 is 50 nm.

With the above steps, a display substrate (i.e., a color filter substrate) shown in FIG. 1a can be manufactured.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit

TABLE 1

| Position | Red Subpixel | | Green Subpixel | | Blue Subpixel | |
| --- | --- | --- | --- | --- | --- | --- |
| | Top surface of pixel definition layer 11 | Side surface of pixel definition layer 11 | Top surface of pixel definition layer 11 | Side surface of pixel definition layer 11 | Top surface of pixel definition layer 11 | Side surface of pixel definition layer 11 |
| Exposure Time(s) | 0.5 | 5 | 0.7 | 6 | 0.5 | 5 |

What is claimed is:

1. A display substrate having a plurality of subpixel regions, comprising a base substrate and a pixel definition layer for defining a plurality of subpixel openings on the base substrate, the plurality of subpixel openings being in one-to-one correspondence with the plurality of subpixel regions, each of the plurality of subpixel openings being located in a corresponding one of the plurality of subpixel regions, wherein,
the display substrate further comprises a functional medium layer in each of the plurality of subpixel regions and on a side of the pixel definition layer away from the base substrate,
the functional medium layer comprises a first portion covering side surfaces of each of the plurality of subpixel openings and a second portion covering a top surface of the pixel definition layer, and
in a same subpixel region of the plurality of subpixel regions, surface energy of the first portion is greater than surface energy of the second portion,
each of the first and second portions comprises a lyophobic polymer photo-grafted with a lyophilic monomer material, and
a grafting ratio of the first portion is greater than a grafting ratio of the second portion.

2. The display substrate of claim 1, further comprising a body material layer between the pixel definition layer and the functional medium layer and covering a bottom of each of the plurality of subpixel openings and the top surface and side surfaces of the pixel definition layer,
a portion of the body material layer covering the bottom of each of the plurality of subpixel openings serves as a third portion, and
a surface of the third portion away from the base substrate is a rough surface.

3. The display substrate of claim 2, wherein the rough surface has a roughness in a range from 2 μm to 10 μm.

4. The display substrate of claim 2,
the body material layer comprises a lyophobic polymer, both of the lyophobic polymer in the body material layer and the lyophobic polymer photo-grafted with the lyophilic monomer material are polyethylene terephthalate, and
the lyophilic monomer material is acrylic acid or acrylamide.

5. The display substrate of claim 1, further comprising: a red display pattern, a green display pattern and a blue display pattern respectively in the plurality of subpixel openings, all of the red display pattern, the green display pattern and the blue display pattern comprising an ink-type material, wherein
the red display pattern comprises a red quantum dot photoluminescent material,
the green display pattern comprises a green quantum dot photoluminescent material, and
the blue display pattern comprises a blue color filter material.

6. The display substrate of claim 5, further comprising: a plurality of color filter films between the base substrate and the pixel definition layer, wherein
the plurality of color filter films are in one-to-one correspondence with the plurality of subpixel regions respectively,
the plurality of color filter films comprise a red color filter film, a green color filter film and a blue color filter film,
an orthographic projection of the red color filter film on the base substrate overlaps an orthographic projection of the red display pattern on the base substrate,
an orthographic projection of the green color filter film on the base substrate overlaps an orthographic projection of the green display pattern on the base substrate, and
an orthographic projection of the blue color filter film on the base substrate overlaps an orthographic projection of the blue display pattern on the base substrate.

7. The display substrate of claim 6, further comprising a planarization layer and a wire-grid polarizing plate, wherein
the planarization layer is on a side of the plurality of subpixel openings away from the base substrate and covers the plurality of subpixel openings, and
the wire-grid polarizing plate is on a side of the planarization layer away from the base substrate.

8. A display device comprising the display substrate of claim 1.

9. A method for manufacturing a display substrate having a plurality of subpixel regions comprising:
forming a pixel definition layer on a base substrate, the pixel definition layer defining a plurality of subpixel openings, and each of the plurality of subpixel openings occupying one of the plurality of the subpixel regions;
forming a functional medium layer in each subpixel region and on a side of the pixel definition layer away from the base substrate, wherein
the functional medium layer comprises: a first portion covering side surfaces of each of the plurality of subpixel openings and a second portion covering a top surface of the pixel definition layer, and
in a same subpixel region, surface energy of the first portion is larger than surface energy of the second portion,
wherein forming the functional medium layer in each subpixel region and on a side of the pixel definition layer away from the base substrate comprises:
forming a lyophobic polymer layer covering a bottom of each of the plurality of subpixel openings, the side surfaces of each of the plurality of subpixel openings, and the top surface of the pixel definition layer to obtain a body material layer;
forming a lyophilic monomer material layer on a side of the body material layer away from the base substrate;
exposing the body material layer and the lyophilic monomer material layer such that:
in any one subpixel region, portions of the body material layer and the lyophilic monomer material layer at the bottom of each of the plurality of subpixel openings are not exposed, and an exposure amount of portions of the body material layer and the lyophilic monomer material layer at the side surfaces of each of the plurality of subpixel openings is greater than an exposure amount of portions of the body material layer and the lyophilic monomer material layer at the top surface of the pixel definition layer, and
a lyophilic monomer material in the lyophilic monomer material layer is photo-grafted with lyophobic polymer in an upper portion of the body material layer to form the first portion and the second portion of the functional medium layer, and a grafting ratio of the first portion is greater than a grafting ratio of the second portion; and
removing the lyophilic monomer material layer at the bottom of each of the plurality of subpixel openings.

10. The method of claim 9, further comprising: after the lyophilic monomer material layer at the bottom of each of the plurality of subpixel openings is removed, dry-etching a third portion of the body material layer at the bottom of each of the plurality of subpixel openings to form a rough surface.

11. The method of claim 10, wherein
the rough surface has a roughness in a range from 2 µm to 10 µm.

12. The method of claim 10, after dry-etching the third portion of the body material layer at the bottom of each of the plurality of subpixel openings to form the rough surface, further comprising:
respectively forming a red display pattern, a green display pattern and a blue display pattern in the plurality of subpixel openings, wherein all of the red display pattern, the green display pattern and the blue display pattern are made of an ink-type material;
curing the red display pattern, the green display pattern, and the blue display pattern, wherein
the red display pattern is made of a red quantum dot photoluminescent material,
the green display pattern is made of a green quantum dot photoluminescent material, and
the blue display pattern is made of a blue color filter material.

13. The method of claim 12, further comprising: forming a red color filter film, a green color filter film and a blue color filter film in sequence between the base substrate and the pixel definition layer, wherein
the red color filter film, the green color filter film and the blue color filter film are in one-to-one correspondence to the plurality of subpixel regions respectively,
an orthographic projection of the red color filter film on the base substrate overlaps an orthographic projection of the red display pattern on the base substrate,
an orthographic projection of the green color filter film on the base substrate overlaps an orthographic projection of the green display pattern on the base substrate, and
an orthographic projection of the blue color filter film on the base substrate overlaps an orthographic projection of the blue display pattern on the base substrate.

14. The method of claim 13, further comprising:
forming a planarization layer on a side of the plurality of subpixel openings away from the base substrate to cover each of the plurality of subpixel openings; and
forming a wire-grid polarizing plate on a side of the planarization layer away from the base substrate.

15. The method of claim 9, wherein
the lyophobic polymer is polyethylene terephthalate, and the lyophilic monomer material is acrylic acid or acrylamide.

* * * * *